United States Patent
Rosenberg

(10) Patent No.: US 8,260,695 B1
(45) Date of Patent: Sep. 4, 2012

(54) SECONDARY POWER METER FOR QUARTER-CYCLE POWER MEASUREMENT AND INVOICING METHOD

(76) Inventor: Steven Rosenberg, South Plainfield, NJ (US)

( * ) Notice: Subject to any disclaimer, the term of this patent is extended or adjusted under 35 U.S.C. 154(b) by 23 days.

(21) Appl. No.: 12/835,798

(22) Filed: Jul. 14, 2010

(51) Int. Cl.
*G07F 19/00* (2006.01)

(52) U.S. Cl. ......... 705/34; 324/76.11; 324/399; 702/57; 705/16; 323/220; 323/300

(58) Field of Classification Search ............... None
See application file for complete search history.

(56) References Cited

U.S. PATENT DOCUMENTS

| | | | |
|---|---|---|---|
| 3,800,893 A * | 4/1974 | Ramsay et al. ............ 177/25.14 |
| 3,938,040 A | 2/1976 | Lofmark |
| 4,091,205 A * | 5/1978 | Onda et al. ........................ 536/85 |
| 4,373,549 A * | 2/1983 | Nalepa et al. ............. 137/487.5 |
| 4,401,943 A | 8/1983 | Morris |
| 4,454,108 A * | 6/1984 | Iida et al. ........................ 424/472 |
| 4,741,023 A * | 4/1988 | Lawson ................... 379/106.01 |
| 4,806,854 A | 2/1989 | Mayer |
| 4,879,626 A | 11/1989 | Kim |
| 4,930,895 A * | 6/1990 | Nishimura et al. ............ 356/494 |
| 5,182,547 A | 1/1993 | Griffith |
| 5,406,495 A * | 4/1995 | Hill .................................. 702/72 |
| 5,463,307 A | 10/1995 | Rosenberg |
| 5,668,480 A * | 9/1997 | Nintzel ........................... 324/709 |
| 5,719,898 A * | 2/1998 | Davidovici et al. ........... 375/130 |
| 5,961,617 A * | 10/1999 | Tsang ............................. 710/100 |
| 6,154,687 A * | 11/2000 | Hart et al. ...................... 700/294 |
| 6,469,491 B1 | 10/2002 | Schultz |
| 7,795,749 B1 * | 9/2010 | Weber ............................. 290/53 |
| 2005/0046416 A1 * | 3/2005 | Harris ....................... 324/207.24 |
| 2006/0064344 A1 * | 3/2006 | Lidow ............................... 705/10 |
| 2006/0218052 A1 * | 9/2006 | Haynes et al. .................... 705/26 |
| 2008/0048645 A1 | 2/2008 | Leibl |
| 2008/0115104 A1 * | 5/2008 | Quinn ............................. 717/101 |
| 2010/0006551 A1 * | 1/2010 | Geissler et al. ............ 219/130.1 |
| 2010/0174629 A1 * | 7/2010 | Taylor et al. ..................... 705/34 |
| 2010/0235008 A1 * | 9/2010 | Forbes et al. ................... 700/291 |

* cited by examiner

Primary Examiner — Ryan Zeender
Assistant Examiner — Fateh Obaid
(74) Attorney, Agent, or Firm — Michael J. Feigin, Esq.; Feigin and Associates, LLC

(57) ABSTRACT

The disclosed technology comprises a device and a method for accurately determining the amount of electrical energy utilized in a circuit with a quarter-cycle transformer and transducers operating off quarter-cycle power. The method allows for a primary power meter associated with an entity which provides a power source to remain in operation, without modification, and for a second power meter to be utilized which accurately measures consumption of quarter-cycle power usage. An adjustment to an invoice can then be made, based on the difference.

19 Claims, 4 Drawing Sheets

| Invoice 300 | | | | | |
|---|---|---|---|---|---|
| | Current 310 | Voltage 320 | Time 330 | Power 340 | Unit Price 350 | Price Total 360 |
| Full Cycle 370 | 10A | 5V | 2 Hr | 100kwh | $1/kwh | $100 |
| Quarter Cycle 380 | 8A | 5V | 2 Hr | 80kwh | $1/kwh | $80 |
| Credit 390 | 2A | 5V | 2 Hr | 20kwh | $1/kwh | $20 |

Figure 3

SECONDARY POWER METER FOR QUARTER-CYCLE POWER MEASUREMENT AND INVOICING METHOD

FIELD OF THE DISCLOSED TECHNOLOGY

The disclosed technology relates generally to measurements of high efficiency, low voltage loads.

BACKGROUND OF THE DISCLOSED TECHNOLOGY

U.S. Pat. No. 5,463,307 issued to the present inventor, discloses a circuit capable of controlling the power to a load having a predetermined voltage rating. The circuit includes a first terminal adapted to connect to the load and a second terminal adapted to be connected through a power switch to an alternating voltage source. This voltage source has a magnitude rated substantially in excess of the predetermined voltage rating. A switching device is serially connected between the first and second terminal. Also, a capacitive filter circuit has dual terminals separately connected to the first and second terminals. This filter can shunt from the transformer circuit transient currents, preventing inconsistent flow through the load. A timing circuit is coupled to the switching device for its periodic operation at a frequency identical to that of the alternating voltage source. The switching device is timed by the timing circuit to keep the magnitude of average voltage to the load at less than peak of the alternating voltage source, for a quarter cycle of the alternating voltage source.

Alternating current is propagated as a sine (or cos) wave. By using the methods or apparatuses disclosed in the '307 reference, only the last 90 degrees, or last ¼ of the sine wave, need be used. For the remaining 270 degrees or ¾ of the sin wave, no power need be drawn to operate a transducer (an electrical sink, such as a light bulb).

The '307 patent is hereby incorporated by reference; however, a new problem has arisen with respect to the technology. Present power meters, such as those installed in homes by power companies throughout the United States and, presumably, around the world, do not accurately measure power consumption on a circuit where only a quarter-cycle (or periodic operation) power connected to a low resistance lamp is being used. As it is difficult to implement new power systems which, even if more energy-efficient, require expansive changes to an existing electrical grid, a more cost-effective method for implementing such a change is needed.

SUMMARY OF THE DISCLOSED TECHNOLOGY

The disclosed technology described herein addresses a need unfulfilled in the prior art by providing a device and a method that provides an accurate representation of the electrical energy utilized in the device and method described in U.S. Pat. No. 5,463,307. More specifically, the disclosed technology provides a load measuring device that works in conjunction with the standard load-measuring devices of the prior art. A disclosed load-measuring device determines an amount of electrical energy used by quarter-cycle appliances.

In an embodiment of the disclosed technology, a device for measuring a quarter-cycle load on a full cycle power circuit has a single phase power source connected inline to a first power meter and an adapter coupled to the single-phase power source which outputs one-quarter cycle current to a transducer. A pickup between the single-phase ¼ cycle power source and the transducer is coupled to a voltage measuring device, and a current measuring (shunt) device is coupled after the transducer. Using this arrangement of devices, a measurement of the quarter-cycle power usage is obtained.

In the above arrangement, the first power meter may be provided by an electric company supplying the power source. A second power meter may then record the measurement of the quarter-cycle power usage, and may compute a difference in power usage reported between a measurement of ¼ cycle power by the first power meter and the measurement of the ¼ cycle power usage by the second meter. Power usage can then be credited to an account holder of the first power meter, based on the difference measured. The measurement of the quarter-cycle based power may be obtained by an integration computation of sampled input voltage and input current. An improvement not obvious is to compute the ¼ cycle voltage by algorithm including input peak voltage and ¼ cycle current pulse width, measured in Ms. The current-measuring device may be coupled to a neutral wire, may be a shunt resistor, and may be a Hall Effect transducer.

The measuring device, such as used with the second power meter, may measure over a period of time, and transmit data for each billing cycle to calculate a difference in measured power consumption and arrange credit in this manner. An improvement in cost effective redundancy allows the secondary meter to similarly transmit the power measurement typically the domain of the first meter.

A method of measuring energy consumption is also disclosed. The method is carried out by receiving single-phase electrical power via a power meter configured to measure usage of said single-phase electrical power, transforming a portion of the single-phase electrical power to one quarter-cycle alternating current at a transformer, electrically connecting a transducer to the transformer and powering the transducer via one quarter-cycle power, and measuring one quarter-cycle voltage usage via an electrical connection placed after the transformer and measuring one quarter-cycle current usage via an electrical connection placed after the transducer.

A result of the primary meter measuring ¼ cycle power is determined by emulation in the secondary meter. Emulation may be compared to a result measured at the secondary power meter and a pre-determination made if the results differ greater than a pre-designated error threshold. A credit for billed power usage may then be sought if compared results differ greater than the pre-designated threshold. A company providing the single phase electrical power may be notified if the results differ greater than the pre-designated threshold.

The measurement of the quarter-cycle-based power may be obtained by a measurement of input voltage and input current. A current measuring device may be coupled to a neutral wire and may be a current shunt resistor or a Hall Effect transducer. The input voltage may also be computed rather than measured. Method of sampling the electricity and conversion of analog to digital is disclosed in prior art. The transducer may be a plurality of low resistance light bulbs.

Two power meters may be used, a first measuring full cycle current and a second measuring quarter-cycle current, either by way of actual measurement or estimation. Either or both may report energy usage back to a provider of electrical current.

In accordance with these and other objects, which will become apparent hereinafter, the disclosed technology will now be described with particular reference to the drawings.

BRIEF DESCRIPTION OF THE DRAWINGS

FIG. 3 is a chart exhibiting an invoice of a circuit using an adapter in an embodiment of the disclosed technology.

A better understanding of the disclosed technology will be obtained from the following detailed description of the preferred embodiments taken in conjunction with the drawings and the attached claims.

DETAILED DESCRIPTION OF EMBODIMENTS OF THE DISCLOSED TECHNOLOGY

Embodiments of the disclosed technology are a device and a method of measuring electrical power utilized by an electrical circuit comprising a quarter-cycle power usage transducer. In an embodiment of the disclosed technology, a device for measuring a quarter-cycle load on a full cycle power circuit has a single-phase power source connected inline to a first power meter and an adapter coupled to the single-phase power source which outputs one-quarter-cycle current to a transducer. A pickup between the ¼ cycle power source and the transducer is coupled to a voltage measuring device, and a current measuring device is coupled after the transducer. Using this arrangement of devices, a measurement of the quarter-cycle power usage is obtained.

The disclosed technology will become clearer in light of the description of the figures.

Figure 1:
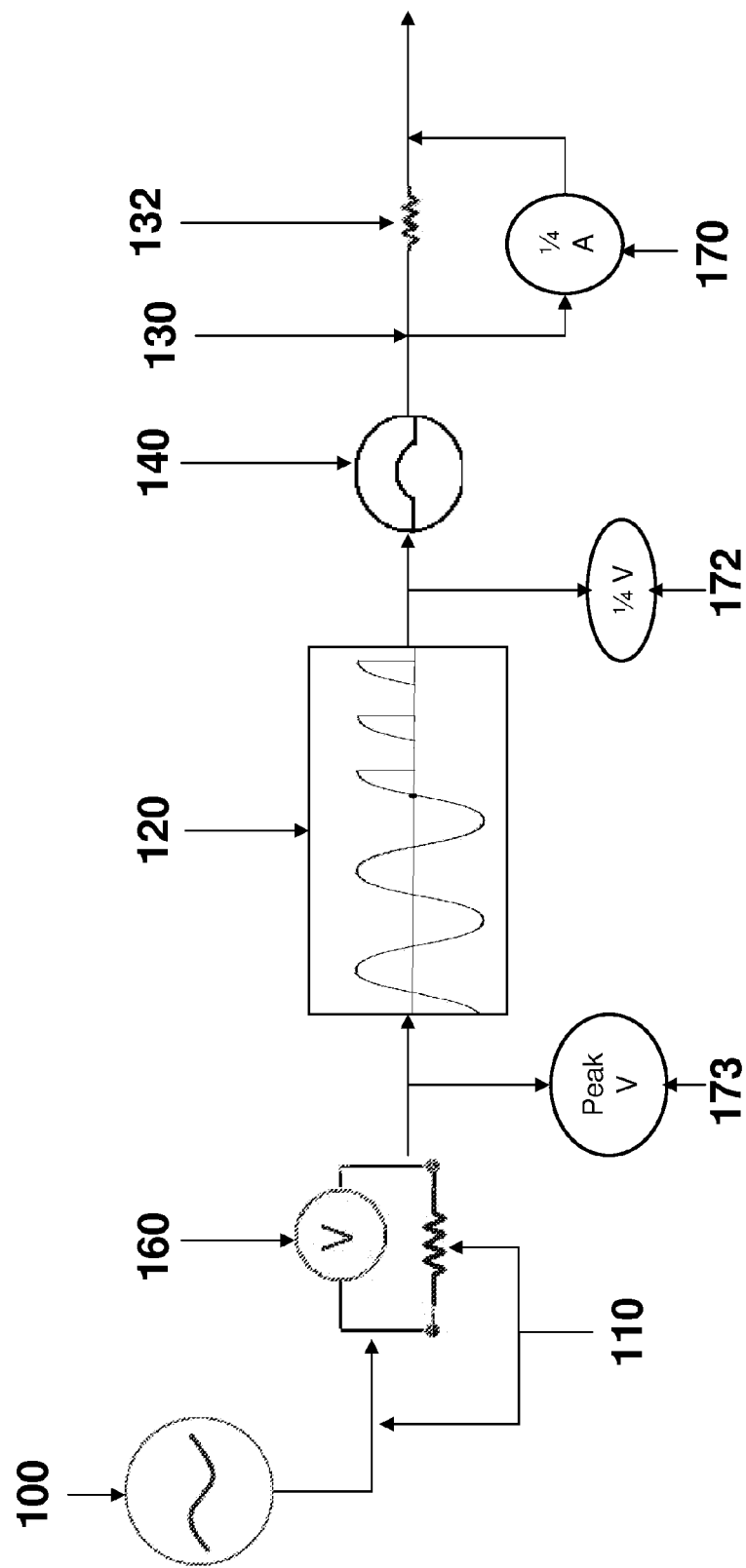
FIG. 1 is a high level circuit diagram of a circuit coupled with a digital load-measuring device in an embodiment of the disclosed technology.

FIG. 1 is a high level circuit diagram of a circuit coupled with a load-measuring device in an embodiment of the disclosed technology. In an embodiment disclosed, the load-measuring device or power meter comprises an alternating current power source (single-phase power source) 100. Such a power source 100, in embodiments of the disclosed technology, is provided by a power or electrical company. This may be a standard HVAC cable 240 volt power line connecting a dwelling, or commercial building connected to power lines in the street, or power lines which are part of an electrical grid. The alternating current power source 100, as is known in the art, is an electrical energy provider which transmits electrical energy that oscillates between positive and negative electrical energies with regular periodicity. An active alternating current (single-phase) is provided at 110 to a power meter 160 used for measuring power consumption at the source side. A primary power meter 160 (a power meter provided by or measuring power usage based on full-cycle usage) is provided. The first power meter may be a standard power meter provided by an electric company, as is customary for each power customer, account, sub-account, or power zone within a building. This power meter 160, in embodiments of the disclosed technology, is electrically placed between the power source 100 and transformer 120.

The transformer or adapter 120 is electrically coupled to the alternating current between the power meter 160 and a transducer 140. The transformer, as shown in the figure, takes a full cycle input and outputs a quarter of the cycle or less. Viewing the cycle of single phase alternating current input as a sine wave, the last 90 degrees, or one quarter, of each sine wave is used, and only this portion is used as an output in embodiments of the disclosed technology. The transducer 140 is any power sink operating on the one-quarter cycle power. A low resistance light bulb or series of light bulbs, for example, operates well on such a power cycle, while actually receiving less power input, that is, less wattage per unit of time. Other examples of transducers used in embodiments of the disclosed technology include mechanical devices, electronics, and hardware appliances.

Referring still to FIG. 1, a device 160 is coupled to the input power emanating from the power source 100. A voltage measuring device 160, measures source input voltage and current. These devices comprise the primary meter. A voltage measuring device 173 measures peak sine voltage. The source voltage is measured at this point is used in simulation. The secondary meter similarly measures source voltage and current and by integration of the source voltage with the ¼ cycle current establishes the pre-determined limit. In embodiments of the disclosed technology, the shunt 132 is a bypass wire or current transformer where a portion of the ¼ cycle current is passed through. Having a smaller portion of the current pass through the shunt, the secondary meter current measuring device is able to more accurately measure the source 120. In an embodiment described, the voltage measuring device 172 is a device capable of measuring the voltage potential between two points in the circuit, such as a standard voltmeter, a potentiometer, an oscilloscope, and the like. To further improve the measurement process wire 172 can be deleted and replaced with a computational algorithm measuring peak source voltage 173 and ¼ cycle current pulse width 170 and so computing the transformer ¼ cycle output voltage.

In an embodiment of the disclosed technology, as exhibited in FIG. 1, a current-measuring device 170 is coupled to the circuit at point 130, after the transducer 140, wherein the current-measuring device 132 measures the current passing there-through (which is a one quarter cycle current). The current measuring device quantitatively determines the amount of the electrical current that is passing through a wire at a given moment. The current-measuring device 132 may be a Hall Effect transducer, a shunt resistor, a moving iron ammeter, an electrodynamic ammeter, a digital ammeter, a time integration ammeter, and/or a combination thereof. Placement of the current-measuring device 170 after the transducer 140 allows an accurate measurement of the energy that was utilized by the transducer. In embodiments of the disclosed technology, the current-measuring device 170 is coupled to a neutral wire which is further coupled to the second electrical wire 132 for the purposes of a more accurate determination of the electrical energy utilized.

In a further embodiment of the disclosed technology, the load-measuring device provides a measurement of quarter-based power, where quarter-based power is defined as the amount of electrical energy being utilized by the transducer 140. The quarter-based power may be generated by a multiplication (integration of ¼ cycle voltage and current data streams) computing a product of active one-quarter cycle voltage over duration of time with active one-quarter cycle current over a duration of time. In further embodiments of the disclosed technology, the device simulates the operation of the primary meter measuring ¼ cycle current and the systemic error there in. Other methods known in the art for determining power used in a circuit may be used if those methods employ values of the active voltage and the active current, as determined by an embodiment of the disclosed technology.

The load-measuring device provides a measurement of full power, where the full-cycle power is the amount of electrical energy utilized by the transducer if the adapter 120 is not coupled to the circuit. A measurement of full cycle power is provided by a standard electrical measurement device, such as a standard power meter, described above. However, such a device measures as if full cycle power were being used by a transducer. Therefore, a user who has saved electrical energy (used less) by employing the adapter 120 is still billed as if a full cycle transducer were used. Using the provided power meter, that is, without changing the infrastructure of the electrical grid or the associated power meter at a building, the present technology allows for improved efficiency on the order of 20% or greater in tests, and for the customer to be billed accordingly. For example, in prior art systems, one-quarter-based power at 100 kilowatt-hours is billed as if 120 kilowatt-hours were used.

The load-measuring device or secondary power meter provides an invoice for power used, wherein the power used is calculated on the measurement of one-quarter-based power vs. emulated or simulated measurement of source full power product of voltage with ¼ cycle current reported by the primary meter. The resulting credit or invoice is a more accurately billed representation of the energy utilized by the transducer 140 coupled with the adapter 120. In embodiments disclosed, the invoice may comprise a form of billing, a notice of consumption of energy, information necessary for moderation of energy provided, a combination thereof, and the like. In further embodiments of the disclosed technology, the invoice comprises a credit, where the credit has a transferable value proportionate to the amount of energy saved by employing the adapter 120, which is determined as the difference between the reported measurement of full power by the primary meter and the measurement of one-quarter-based power. Examples of the credit include a deduction of money owed for electrical energy consumption and a future amount of electrical energy for utilization at a modified cost. For example, if a 100 kilowatt-hours and measurement of one-quarter-based power of the same circuit for the same duration of time is 80 kilowatt-hours, 80 kilowatt-hours is the correct amount of energy utilized in the circuit. An invoice is created that charges a user of the circuit only for the 80 kilowatt-hours utilized. Furthermore, the invoice may comprise an initial charge of the 100 kilowatt-hours and a credit of 20 kilowatt-hours (from 100 minus 80). The credit of 20 kilowatt-hours may be deducted from the current 100 kilowatt hours or from invoices of future utilization of electrical energy, and result in compensation for electrical power previously paid for and not utilized, and the like.

Figure 2:
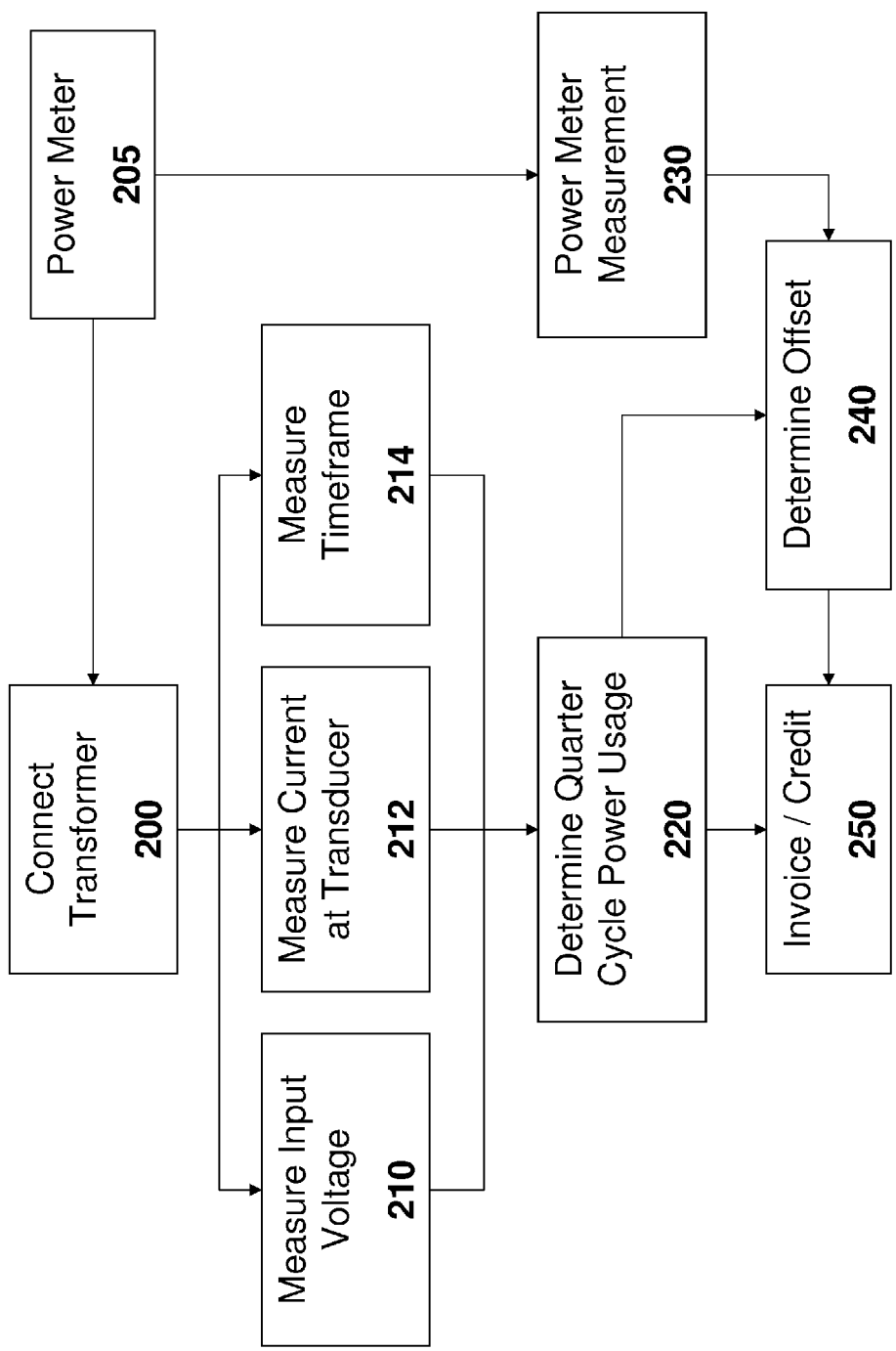
FIG. 2 is a high level block diagram showing a method and devices for measuring energy consumption in an embodiment of the disclosed technology.

FIG. 2 is a high level block diagram showing a method and devices for measuring energy consumption in an embodiment of the disclosed technology. A transformer 200 which transforms full cycle alternating current (single-phase) into quarter-cycle power is connected to an existing power circuit. A power meter 205, such as provided by an electric company, exists on such a circuit and remains unmodified in embodiments of the disclosed technology. A transformer, such as transformer 120 described with reference to FIG. 1, is connected to a power meter 205 and outputs quarter-cycle power. A measurement of the voltage is made at an input, that is, before a transducer or power sink in the circuit and, for convenience, often at the power meter or before the transformer 173. The voltage exiting from the power meter (or circuit breaker) remains roughly constant throughout the circuitry down the line from the meter, so voltage at any point thereon down the line may be measured. A volt meter may be used to carry out this measuring. At the transducer, however, current is measured 212 to determine how much current is flowing. Thus an amp meter or the like, as described above, may be used. The measurements of voltage and current must be with respect to a specific time, so a time measurement 214 is made in order to get an accurate portrayal of power usage over time, for which a customer is billed (or credited). For example, as will be seen in FIG. 3, with a current of 8 amps, 5 volts, and a time period of two hours, it may be calculated (using formulas known in the art) that 80 kilowatt hours have been consumed. Thus, in 220, the quarter-cycle power usage has been determined. A second power meter may receive inputs resulting from the measurements in 210, 212, and 214 and record such data, as well as provide an output of quarter-cycle power usage in step 220.

In order to determine whether a credit needs to be issued, or a customer be billed properly based on actual power usage, the calculation in 220 needs to be compared to the measurement according to the power meter made in step 230. This is a measurement typically taken by a power meter provided by a power company, that is, a provider of the power source. If there is a difference, above a threshold (such as at or above a one cent change in an amount to be billed, a one dollar change, or a ten dollar change), such an offset or price difference 240 is calculated. This calculation or determination may be made by a customer of the power company or customer of a power source provider making the determination with equipment provided by a neutral third party or with equipment such as a second meter provided by a power company. A power company may simply send its agent to read both the first meter 205 and a second meter provided to measure an output of quarter-cycle power usage data. A cost effective improvement allows the secondary meter to perform the primary meter function and incorporate the primary meter entirely. This results in an improvement in redundancy of meters. Such data may also be transmitted by phone or another mechanism to a power company, where a determination of price difference is made, and an invoice 250 reflects such a reduced power usage without a need to modify already installed equipment. Similarly, a credit may be issued to the account if such data is provided after an invoice has already been calculated or estimated.

FIG. 3 is a chart exhibiting an invoice of a circuit using an adapter in an embodiment of the disclosed technology. In the example exhibited, purely for illustrative purposes, the invoice 300 comprises values in each column which correspond to measurements of current 310, measurements of voltage 320, measurements of time 330, measurements of power 340, unit price for power 350, and total price for power 360. The first row of values corresponds to measurements made by a standard electrical measurement device 370. These values are an inaccurate measurement of the amount of electrical energy utilized by a circuit that has incorporated the adapter 120 referenced in U.S. Pat. No. 5,463,307. The second row of values corresponds to measurements made by a quarter-based cycle measurement device 380, as discussed above. The measurements made by the quarter-based cycle measurement device accurately exhibit the amount of electrical energy used in a circuit that comprises the adapter 120. In an embodiment of the disclosed technology, a row corresponds to the values of a credit 290, where the credit is comprised of the difference between the accurate and the inaccurate measurements of current, the voltage used, the duration of time, the electrical energy saved, the electrical energy consumed, and the amount of money saved from usage of the adapter 120. In an embodiment disclosed, the invoice 300 comprises information for billing, and a user of the electrical device pays only the total price for power 360 that is accurately determined by the measurements by a quarter-based cycle measurement device 370. In a further embodiment of the disclosed technology, a user pays the total price of power 360 from the standard electrical measurement device 370, and the user is compensated for the money saved in the form of the credit 390. As mentioned above, the credit may be an amount of money that is rewarded back to the user. In the example displayed, the user would have paid $100 to a supplier of the electrical power and then would later receive at least $20 back, or will have at least $20 deducted from his/her next payment.

Figure 4:
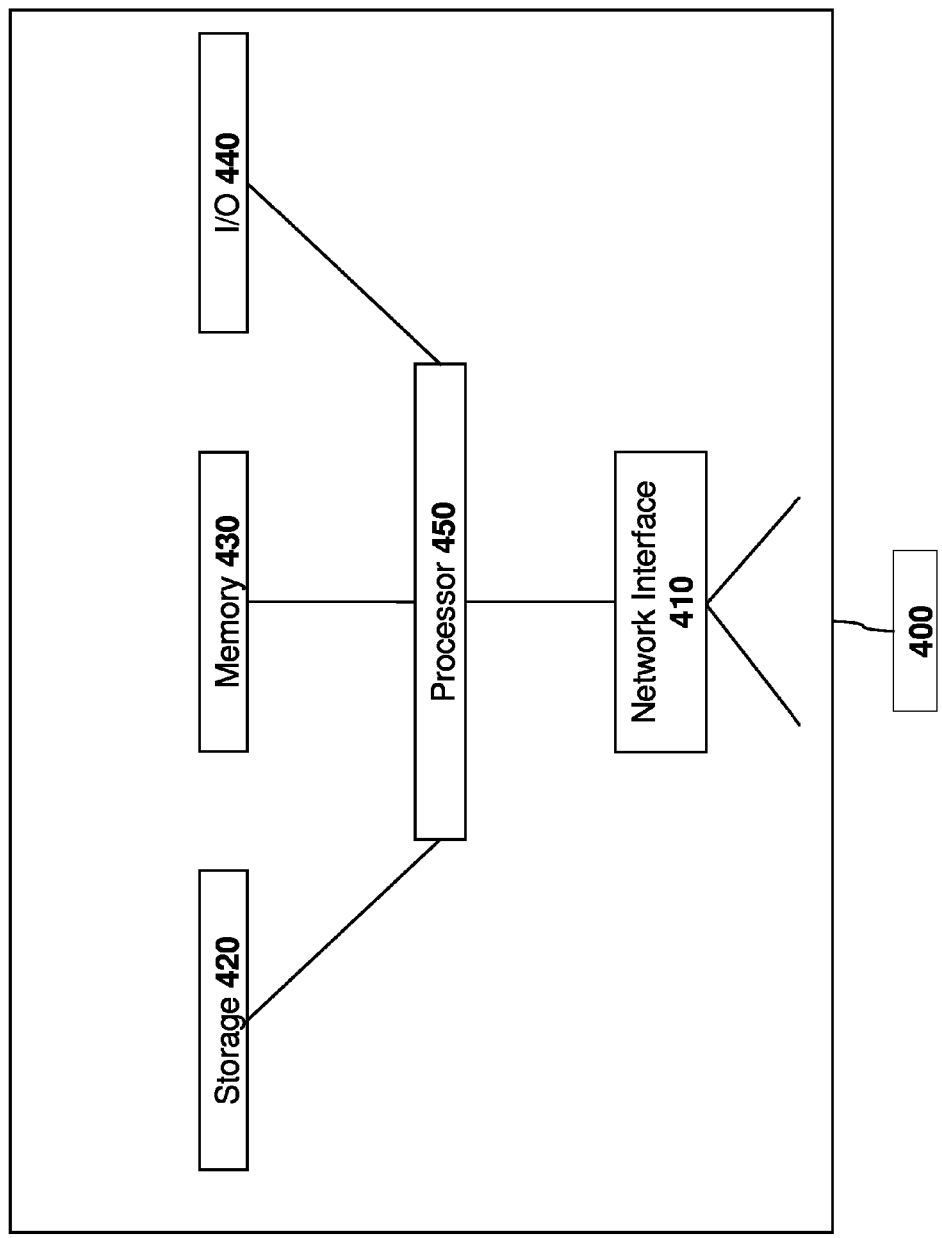
FIG. 4 is a high level block diagram showing a device on which embodiments of the disclosed technology may be carried out.

FIG. 4 shows a high level block diagram showing a device on which embodiments of the disclosed technology may be carried out. Device 400 comprises a processor 450 that controls the overall operation of the computer by executing the device's program instructions which define such operation. The device's program instructions may be stored in a storage device 420 (e.g., magnetic disk, database) and loaded into memory 430 when execution of the console's program instructions is desired. Thus, the device's operation will be defined by the device's program instructions stored in memory 430 and/or storage 420, and the console will be controlled by processor 450 executing the console's program instructions. Programming instructions intended to further improve energy conserving functions know to the art, such as daylight compensation, demand response, and other practices, may be operated via console modification of the ¼ cycle transformers timing circuit. Digital power quality data may be similarly accumulated by the consoles connection to the grid. A device 400 also includes one or a plurality of input network interfaces for communicating with other devices via a network (e.g., the Internet). The device 400 further includes an electrical analog to digital input interface for receiving power and data from a power source. A device 400 also includes one or more output network interfaces 410 for communicating with other devices. Device 400 also includes input/output 440 representing devices may include a graphical interface which allow for user interaction with a computer (e.g., display, keyboard, mouse, speakers, buttons, readouts etc.). One skilled in the art will recognize that an implementation of an actual device will contain other components as well, and that FIG. 4 is a high level representation of some of the components of such a device for illustrative purposes. It should also be understood by one skilled in the art that the method and devices depicted in FIGS. 1 through 3 may be implemented on a device such as is shown in FIG. 4.

While the disclosed technology has been taught with specific reference to the above embodiments, a person having ordinary skill in the art will recognize that changes can be made in form and detail without departing from the spirit and the scope of the disclosed technology. The described embodiments are to be considered in all respects only as illustrative and not restrictive. All changes that come within the meaning and range of equivalency of the claims are to be embraced within their scope. Combinations of any of the methods, systems, computer code, and devices described hereinabove are also contemplated and within the scope of the disclosed technology.

I claim:

1. A device for measuring quarter-cycle load on a full cycle power circuit, comprising:
    a single-phase power source connected inline to a first power meter provided by an electric company;
    an adapter coupled to said single-phase power source which outputs one-quarter cycle alternating current to a transducer;
    a voltage pickup between said single phase power source and said transducer coupled to a voltage-measuring device; and
    a current-measuring device coupled after said transducer;
    a second power meter recording said measurement of said quarter-cycle usage and exhibiting a difference in power usage between a measurement of power by said first power meter and said measurement of said quarter-cycle power usage.

2. The device of claim 1, wherein power usage is credited to an account holder of said first power meter based on said difference.

3. The device of claim 1, wherein said measurement of said quarter-cycle based power is obtained by a computation of input voltage and a measurement of input current.

4. The device of claim 1, wherein said current-measuring device is coupled to a neutral wire.

5. The device of claim 4, wherein said current-measuring device is a current shunt resistor.

6. The measuring device of claim 4, wherein said current-measuring device is a Hall Effect transducer.

7. The measuring device of claim 4, wherein said measuring is carried out over at least one billing cycle and a difference in energy usage is transmitted to a provider of said power source corresponding to said billing cycle.

8. A method of measuring energy consumption comprising:
    receiving single-phase electrical power via a power meter configured to measure usage of said single-phase electrical power;
    transforming a portion of said single-phase electrical power to one-quarter-cycle current at a transformer;
    electrically connecting a transducer to said transformer and powering said transducer via one-quarter-cycle power;
    measuring one-quarter-cycle voltage usage via an electrical connection before said transformer and one-quarter-cycle current after said transducer; wherein a result of said measuring is compared to a result measured at said power meter and a determination is made if said results demonstrate an offset or error in the comparison that differ greater than a pre-designated threshold.

9. The method of claim 8, wherein a credit for billed power usage is sought if said offset results differ greater than said pre-designated threshold.

10. The method of claim 8, wherein a company providing said single phase electrical power is notified if said results differ greater than said pre-designated threshold.

11. The method of claim 8, wherein said measurement of said quarter-cycle-based power is obtained by a computation of input voltage and input current.

12. The method of claim 8, wherein a current-measuring device is coupled to a neutral wire.

13. The method of claim 12, wherein said current-measuring device is a current shunt resistor.

14. The method of claim 12, wherein said current-measuring device is a Hall Effect transducer.

15. The method of claim 12, wherein said measuring is carried out over at least one billing cycle, and said measurement over said billing cycle is transmitted to an electrical service provider for purposes of adjusting an invoice.

16. The method of claim 8, wherein said transducer comprises a plurality of low resistance light bulbs.

17. The method of claim 8, wherein said one-quarter cycle output voltage is estimated.

18. The method of claim 17, wherein said measuring occurs at said power meter.

19. The method of claim 17 wherein said measuring occurs in a second meter and both said power meter and said second meter reports energy usage to a provider of said single-phase electrical power.

* * * * *